United States Patent [19]

Hayashikoshi et al.

[11] Patent Number: 5,554,868
[45] Date of Patent: Sep. 10, 1996

[54] NON-VOLATILE SEMICONDUCTOR MEMORY DEVICE

[75] Inventors: Masanori Hayashikoshi; Yasushi Terada; Takeshi Nakayama; Yoshikazu Miyawaki; Shinichi Kobayashi, all of Hyogo-ken, Japan

[73] Assignee: Mitsubishi Denki Kabushiki Kaisha, Tokyo, Japan

[21] Appl. No.: 300,877

[22] Filed: Sep. 6, 1994

Related U.S. Application Data

[63] Continuation of Ser. No. 810,409, Dec. 20, 1991, abandoned.

[30] Foreign Application Priority Data

Dec. 26, 1990 [JP] Japan ................................ 2-406902

[51] Int. Cl.[6] ............................................... H01L 29/788
[52] U.S. Cl. ......................... 257/315; 365/218; 365/182
[58] Field of Search ............................ 257/315; 365/185, 365/218, 900

[56] References Cited

U.S. PATENT DOCUMENTS

| | | | |
|---|---|---|---|
| 4,841,482 | 6/1989 | Kriefels et al. | 365/185 |
| 5,122,985 | 6/1992 | Santin | 365/185 |
| 5,132,935 | 7/1992 | Ashmore, Jr. | 365/185 |
| 5,237,535 | 8/1993 | Mielke et al. | 365/218 |
| 5,313,432 | 5/1994 | Lin et al. | 365/230.06 |

OTHER PUBLICATIONS

"A 90–ns One–Million Erase/Program Cycle 1–Mbit Flash Memory" IEEE Journal of Solid–State Circuits. vol. 24, No. 5, Oct. 1989.

*Primary Examiner*—Sara W. Crane
*Attorney, Agent, or Firm*—Lowe, Price, Leblanc & Becker

[57] ABSTRACT

There is a case where a memory cell brought to an over-erase (depletion) state if the erasing time is too long, for example, in an electrically erasable non-volatile semiconductor memory device. In this case, the transistor constituting the memory cell is always in ON state and causes erroneous operation. Therefore, it is detected whether there is any memory cell in the over-erase state or not after erasing in each memory cell, and if any memory cell is detected being in the over-erase state, tunnel writing is performed in each memory cell. Specifically, electrons are injected into the floating gate of the transistor constituting each memory cell by a tunnel phenomenon. This causes the memory cell in the over-erase state to recover to a normal state. Detection of the over-erase state and recovery from it are performed by an over-erase correcting circuit 72.

7 Claims, 6 Drawing Sheets

NON-VOLATILE SEMICONDUCTOR MEMORY DEVICE

This application is a continuation of application Ser. No. 07/810,409 filed Dec. 20, 1991, now abandoned.

BACKGROUND OF THE INVENTION

1. Field of the Invention

The present invention relates to a non-volatile semiconductor memory device, and, more particularly, to an electrically erasable non-volatile semiconductor memory device (EEPROM).

2. Description of the Background Art

Figure 5:
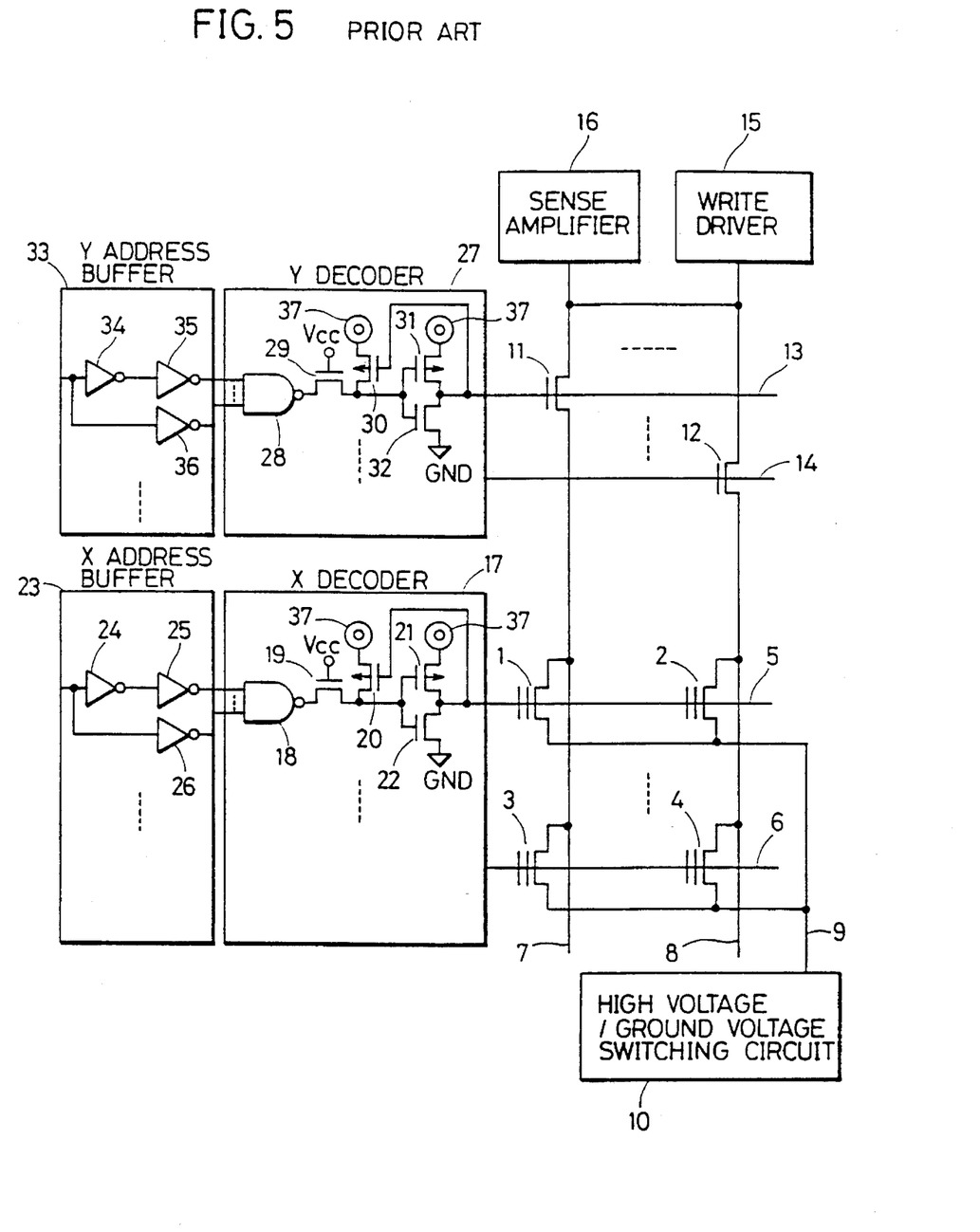
FIG. 5 is a circuit diagram illustrating the structure of a main part of an example of a conventional non-volatile semiconductor memory device.

FIG. 5 is a circuit diagram illustrating a main part of a conventional non-volatile semiconductor memory device. Referring to FIG. 5, a plurality of memory transistors 1–4 are arranged in a matrix manner in the row direction and the column direction. Although only four memory transistors are illustrated in FIG. 5 for simplification, a larger number of memory transistors are arranged in practice. The control gates of memory transistors 1, 2 arranged in the same row are connected in common to a word line 5, and the control gates of memory transistors 3, 4 arranged in the same row are connected in common to a word line 6. The drains of memory transistors 1, 3 arranged in the same column are connected in common to a bit line 7, and the drains of memory transistors 2, 4 arranged in the same column are connected in common to a bit line 8. The sources of memory transistors 1–4 are connected in common to a source line 9. Source line 9 is connected to a high voltage/ground voltage switching circuit 10. A transistor 11 has the gate connected to a Y gate line 13 and the source connected to bit line 7. A transistor 12 has the gate connected to a Y gate line 14 and the source connected to bit line 8. The drain of each of transistors 11, 12 is connected to a write driver 15 as well as to a sense amplifier 16.

Word lines 5, 6 are connected to an X decoder 17. A decoding circuit in X decoder 17 includes an NAND gate 18 and transistors 19–22. NAND gate 18 has the input connected to an X address buffer 23 and the output connected to the source of transistor 19. A supply voltage Vcc is applied to the gate of transistor 19. Accordingly, transistor 19 is always in ON state. The drain of transistor 19 is connected to the drain of transistor 20 and to the gates of transistors 21, 22. A high voltage Vh and the supply voltage Vcc (Vh>Vcc) from a high voltage/supply voltage switching circuit (not shown) are selectively applied through terminals 37 to the sources of transistors 20, 21. The source of transistor 22 is grounded. The drains of transistors 21, 22 are connected in common to the gate of transistor 20 and to word line 5. A decoding circuit having the same structure as the above-described one is provided for each word line in X decoder 17. A buffer circuit in X address buffer 23 includes inverters 24–26 and provides outputs Xi and $\overline{Xi}$ for an address input Xi. Output $\overline{Xi}$ is an inversion signal of output Xi. X address buffer 23 includes the same number of buffer circuits of the above-described structure as the number of the bits of an X address. NAND gate 18 in each of the above decoding circuits selectively receives either the output of inverter 25 or the output of inverter 26 from corresponding one of the above buffer circuits.

Y gate lines 13, 14 are connected to a Y decoder 27. A decoding circuit in Y decoder 27 includes an NAND gate 28 and transistors 29–32. NAND gate 28 has the input connected to a Y address buffer 33 and the output connected to the source of transistor 29. Supply voltage Vcc is applied to the gate of transistor 29. Accordingly, transistor 29 is always in ON state. The drain of transistor 29 is connected to the drain of transistor 30 and to the gates of transistors 31, 32. High voltage Vh and supply voltage Vcc from the high voltage/supply voltage switching circuit (not shown) are selectively applied through a terminal 37 to the sources of transistors 30, 31. The source of transistor 32 is grounded. The drains of transistors 31, 32 are connected to the gate of transistor 30 and to Y gate line 13. Y decoder 27 includes decoding circuits each having the same structure as the above-described one for respective Y gate lines. A buffer circuit in a Y address buffer 33 includes inverters 34–36 and provides outputs Yi and $\overline{Yi}$ for an address input Yi. Output $\overline{Yi}$ is an inversion signal of output Yi. Y address buffer 33 includes the same number of buffer circuits each having the above-described structure as the number of the bits of a Y address. NAND gate 28 in each of the above decoding circuits selectively receives either the output of inverter 35 or the output of inverter 36 from corresponding one of the above buffer circuits.

Figure 6:
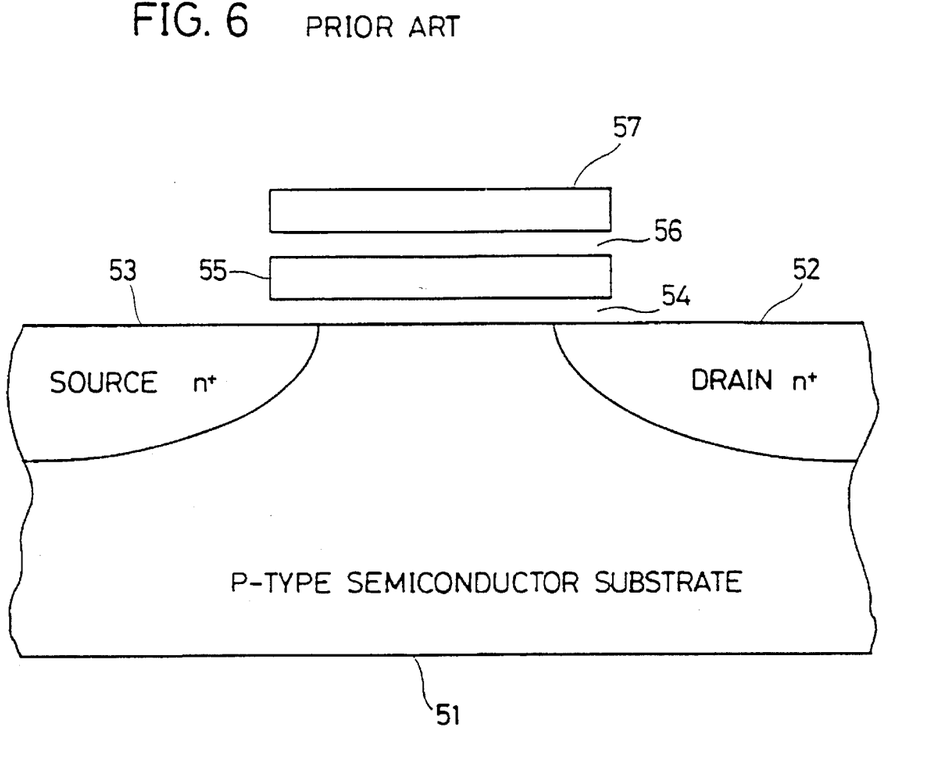
FIG. 6 is a sectional view illustrating a sectional structure of a memory transistor illustrated in FIG. 5.

FIG. 6 is a sectional view illustrating a sectional structure of any one of memory transistors 1–4 illustrated in FIG. 5. Referring to FIG. 6, a diffused drain region 52 and a diffused source region 53 are formed spaced a predetermined distance apart from each other on a part of a P-type semiconductor substrate 51. An extremely thin tunnel oxide film 54 is formed on P-type semiconductor substrate 51, and a floating gate 55 is formed thereon. An oxide film 56 is formed on floating gate 55, and a control gate 57 is formed thereon. Writing into the memory transistor illustrated in FIG. 6 is carried out by applying a high voltage to diffused drain region 52 and to control gate 57 and grounding diffused source region 53. Consequently, an avalanche breakdown occurs in the vicinity of diffused drain region 52, and hot electrons caused by it are injected through tunnel oxide film 54 into floating gate 55. Then, the threshold value of the memory transistor becomes high.

Erasing of the memory transistor illustrated in FIG. 6 is carried out by bringing diffused drain region 52 to a floating state, applying a high voltage to diffused source region 53, and grounding control gate 57. Consequently, electrons are extracted from floating gate 55 through tunnel oxide film 54 to diffused source region 53 by a tunnel phenomenon. Then, the threshold voltage of the memory transistor becomes low.

Now, operation of the conventional non-volatile semiconductor memory device illustrated in FIG. 5 will be described.

First, the erase operation will be described. Erasing is carried out collectively in the whole chip. Y decoder 27 makes the potentials of both of Y gate lines 13, 14 to attain a low or "L" level. This causes transistors 11, 12 to be in OFF state. X decoder 17 makes the potentials of both of word lines 5, 6 to attain "L" level. A high voltage is applied to source line 9 by high voltage/ground voltage switching circuit 10. This causes electrons extracted from the floating gates of memory transistors 1–4 and the threshold values of memory transistors 1–4 to be low. The erasing time at this time is externally controlled.

Now, the write operation will be described. The case where writing into memory transistor 1 is carried out will be described as an example. A high voltage is applied to the drains of transistors 11, 12 by write driver 15. A high voltage is applied from the high voltage/supply voltage switching circuit not shown through terminal 37 to the source of each of transistors 20, 21, 30 and 31. Y decoder 27 applies a high voltage to a selected Y gate line 13 and makes the potential of the non-selected other Y gate line 14 attain "L" level. Therefore, transistor 11 is turned on, and transistor 12 is turned off. X decoder 17 applies a high voltage to a selected word line 5 and makes the potential of the non-selected other word line 6 attain "L" level. Source line 9 is grounded by high voltage/ground voltage switching circuit 10. This causes an avalanche breakdown to occur in the vicinity of the drain of memory transistor 1, and generated hot electrons are injected into the floating gate. Therefore, the threshold value of memory transistor 1 becomes high. The writing time at this time is externally controlled.

Now, the read operation will be described. The case where reading from memory transistor 1 is carried out will be described as an example. The supply voltage is applied from the high voltage/supply voltage switching circuit not shown through terminal 37 to the source of each of transistors 20, 21, 30, and 31. Y decoder 27 makes the potential of a selected Y gate line 13 attain "H" level and makes the potential of the non-selected other Y gate line 14 attain "L" level. Therefore, transistor 11 is turned on, and transistor 12 is turned off. X decoder 17 makes the potential of a selected word line 5 attain "H" level and makes the potential of the non-selected other word line 6 attain "L" level. Source line 9 is grounded by high voltage/ground voltage switching circuit 10. If memory transistor 1 is in the writing state (a state in which the threshold value is high), memory transistor 1 remains off, and no current flows in bit line 7. On the other hand, if memory transistor 1 is in the erasing state (a state in which the threshold value is low), memory transistor 1 is turned on, and current flows in bit line 7. Reading is carried out by sensing the presence and absence of the current by sense amplifier 16.

The conventional non-volatile semiconductor memory device is constituted as described above, so that if the erasing time is erroneously lengthened, more electrons than necessary are extracted from the floating gate of a memory transistor, and the memory transistor is brought to a depletion (over-erase) state. If the memory transistor is brought to the over-erase state, the memory transistor is always in ON state, and subsequent reading/erasing/reading cannot be normally carried out.

SUMMARY OF THE INVENTION

Accordingly, an object of the present invention is to provide an non-volatile semiconductor memory device capable of making a memory cell in an over-erase state recover into a normal state.

A non-volatile semiconductor memory device according to the present invention is electrically erasable and includes a memory cell array, erasing means, writing means, reading means, over-erase detecting means, and tunnel writing means. The memory cell array is constituted including a plurality of memory cells each implemented with a transistor having a floating gate arranged in a matrix manner. The erasing means erases data stored in a memory cell. The writing means writes data into a memory cell. The reading means reads the data written into a memory cell. The over-erase detecting means detects a memory cell in the memory cell array being in an over-erase state. The tunnel writing means operates in response to detection of the memory cell in the over-erase state by the over-erase detecting means and injects electrons into the floating gate of the memory cell by a tunnel phenomenon.

According to the present invention, if detection of whether a memory cell is in the over-erase state is carried out, and it is detected that the memory cell is in the over-erase state, electrons are injected into the floating gate of the memory cell by a tunnel phenomenon. This causes the threshold voltage of the transistor constituting the memory cell to be high, and the memory cell recovers from the over-erase state to a normal state. Specifically, the transistor constituting the memory cell is changed from "depletion" into "enhance".

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
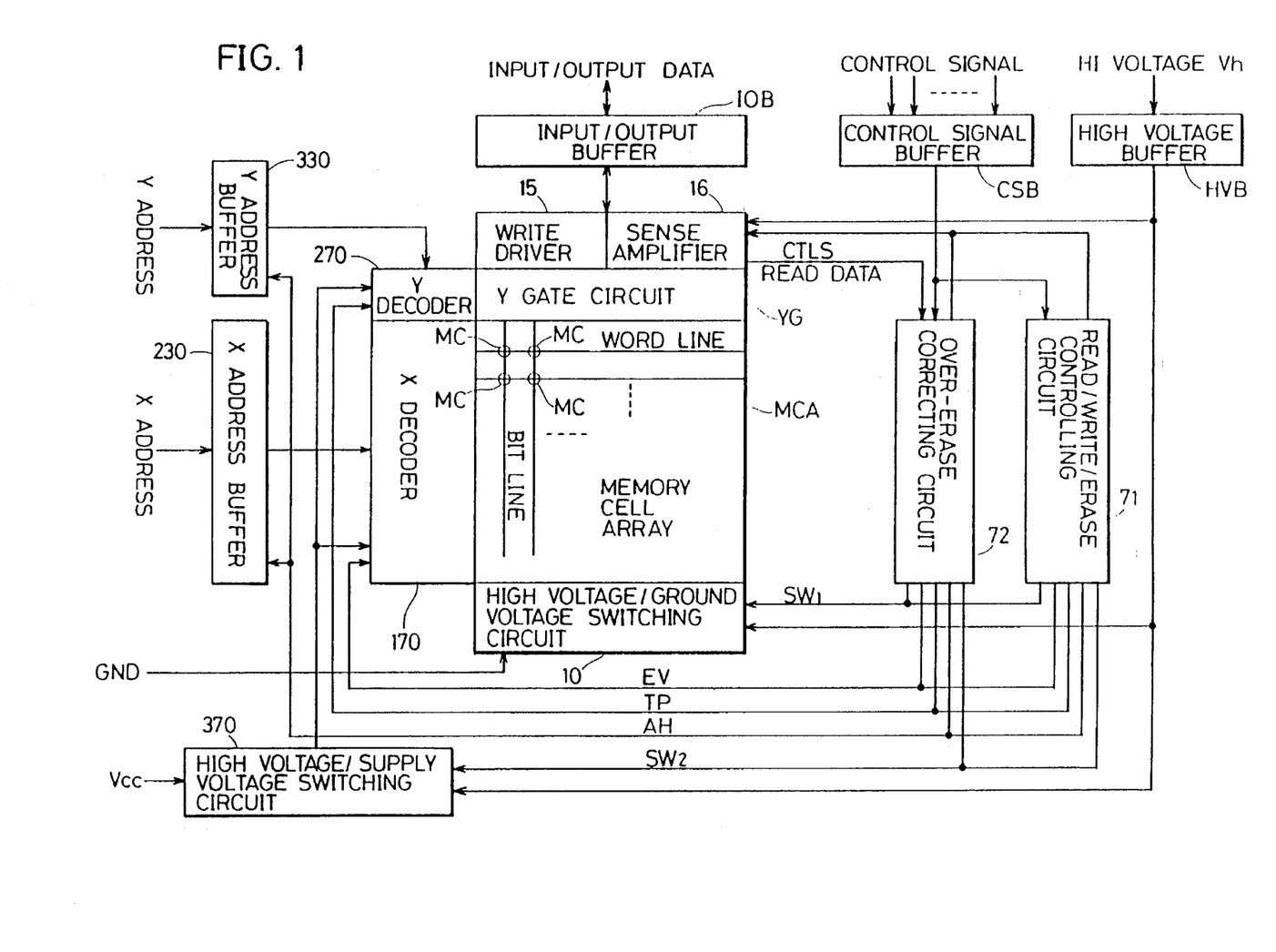
FIG. 1 is a block diagram illustrating the whole structure of an embodiment of the present invention.

FIG. 1 is a block diagram illustrating the whole structure of a non-volatile semiconductor memory device according to an embodiment of the present invention. Referring to FIG. 1, a memory cell array MCA includes a plurality of word lines and a plurality of bit lines arranged crossing each other. Memory cells MC are arranged at respective crossings of the word lines and the bit lines. Each memory cell MC is implemented with a transistor having a floating gate as illustrated in FIG. 6.

Each word line is connected to an X decoder 170. Each bit line is connected to a Y gate circuit YG. Y gate circuit YG includes a plurality of gate transistors interposed between a write driver 15 and sense amplifier 16 and the bit lines. On/off of each gate transistor is controlled by Y decoder 270.

Externally applied X address signal and Y address signal are applied to an X address buffer 230 and a Y address buffer 330, respectively. X address buffer 230 derives the applied X address signal and its inversion signal and applies them to X decoder 170. X decoder 170 selects one word line out of the plurality of word lines in memory cell array MCA on the basis of applied X address signal and its inversion signal. Y address buffer 330 derives applied Y address signal and its inversion signal and applies them to a Y decoder 270. Y decoder 270 selects one gate transistor out of the gate transistors provided for respective bit lines in Y gate circuit YG on the basis of applied Y address signal and its inversion signal and turns it on. This causes one bit line to be selectively connected with write driver 15 and sense amplifier 16. Write driver 15 and sense amplifier 16 are connected to an input/output buffer IOB. Externally applied data is applied through input/output buffer IOB to write driver 15 and sense amplifier 16. Conversely, data read from memory cell array MCA is applied through write driver 15 and sense amplifier 16 to input/output buffer IOB and provided to the outside.

The sources of respective memory cells MC in memory cell array MCA are connected in common to high voltage/ground voltage changing circuit 10. A high voltage Vh is externally applied through a high voltage buffer HVB to high voltage/ground voltage switching circuit 10, and the ground voltage is applied from the outside thereto. High voltage/ground voltage changing circuit 10 selectively applies a high voltage and the ground voltage to the sources of respective memory cells MC in response to a high voltage/ground voltage switching signal SW1 applied from a read/write/erase controlling circuit 71 and an over-erase correcting circuit 72 which will be described in the following.

High voltage Vh is externally applied through high voltage buffer HVB to high voltage/supply voltage switching circuit 370, and supply voltage Vcc is externally applied thereto. High voltage/supply voltage switching circuit 370 selectively provides either a high voltage or the supply voltage in response to a high voltage/supply voltage switching signal SW2 applied from read/write/erase controlling circuit 71 and over-erase correcting circuit 72. The output of high voltage/supply voltage switching circuit 370 is applied to X decoder 170 and Y decoder 270.

Various control signals are externally applied through a control signal buffer CSB to read/write/erase controlling circuit 71 and over-erase correcting circuit 72. The control signals include a chip enable signal, a read enable signal, a write enable signal, an erase enable signal, or an over-erase and tunnel write enable signal or the like, for example. Read/write/enable controlling circuit 71 controls operations in a reading mode, a writing mode, and an erasing mode in response to the applied control signals. Over-erase correcting circuit 72 detects whether a memory cell in an over-erase state is included in memory cell array MCA, and when a memory cell in the over-erase state is included, it controls operations of respective circuits to make the memory cell recover into a normal state. Read/write/erase controlling circuit 71 and over-erase correcting circuit 72 provide a write driver/sense amplifier controlling signal CTLS, a high voltage/ground voltage switching signal SW1, a high voltage/supply voltage switching signal SW2, and control signals AH, TP, EV. Write driver/sense amplifier controlling signal CTLS is applied to write driver 15 and sense amplifier 16 and controls activation and non-activation of them. High voltage/ground voltage switching signal SW1 is applied to a high voltage/ground voltage switching circuit 10 and controls whether a high voltage or the ground voltage is provided by high voltage/ground voltage switching circuit 10. High voltage/supply voltage switching signal SW2 is applied to high voltage/supply voltage switching circuit 370 and controls whether a high voltage or the supply voltage is provided by high voltage/supply voltage switching circuit 370. Control signal AH is applied to X address buffer 230 and Y address buffer 330 and controls activation and non-activation of X address buffer 230 and Y address buffer 330. Control signal EV is applied to X decoder 170. Control signal TP is applied to Y decoder 270.

Figure 2:
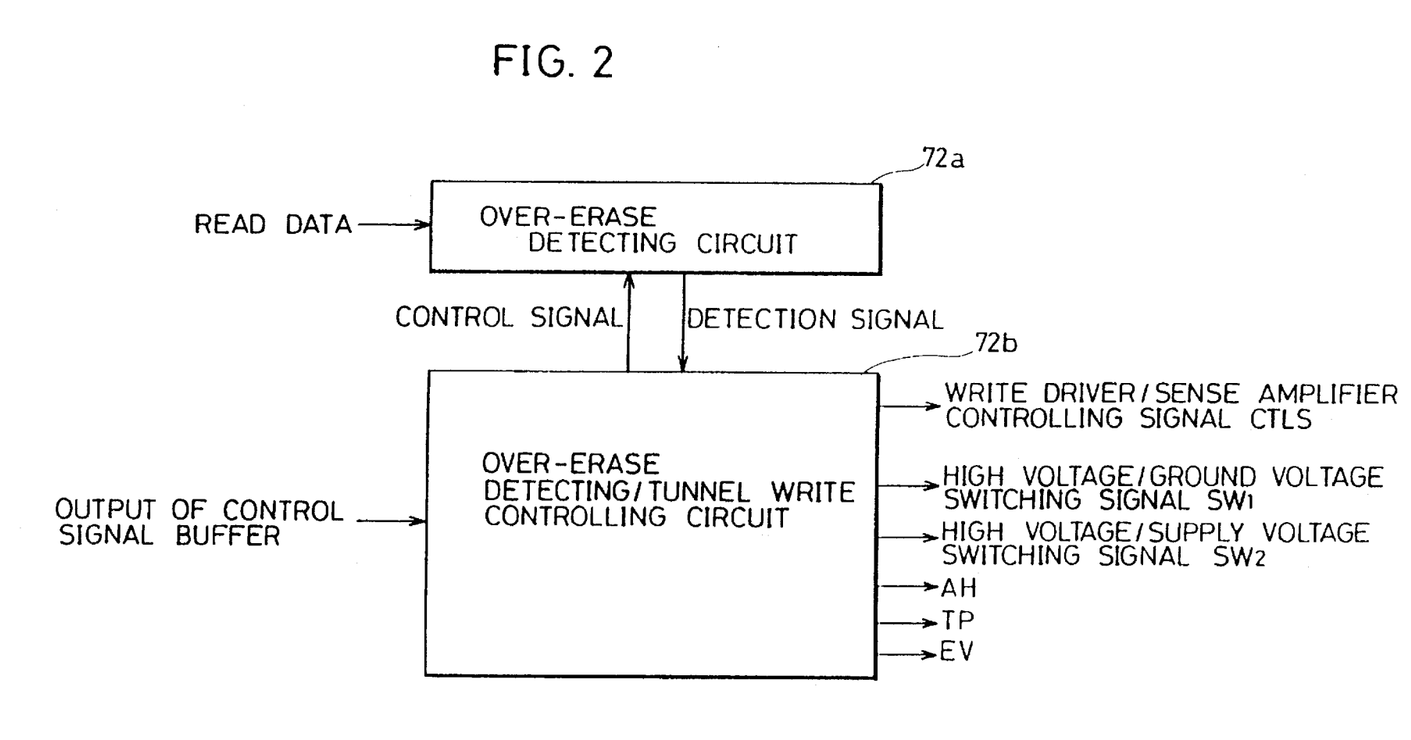
FIG. 2 is a block diagram illustrating a further detailed structure of the over-erase correcting circuit in FIG. 1.

FIG. 2 is a block diagram illustrating a further detailed structure of the over-erase correcting circuit 72 illustrated in FIG. 1. Referring to FIG. 2, over-erase correcting circuit 72 includes an over-erase detecting circuit 72a and an over-erase detecting/tunnel write controlling circuit 72b. Over-erase detecting circuit 72a detects whether a memory cell in the over-erase state is included in memory cell array MCA on the basis of read data applied from sense amplifier 16. A detection signal indicating the detection result of over-erase detecting circuit 72a is applied to over-erase detecting/tunnel write controlling circuit 72b. A control signal from a control signal buffer CSB is applied to over-erase detecting/tunnel write controlling circuit 72b. Responding to direction of the over-erase state of a memory cell by over-erase detecting circuit 72a, over-erase detecting/tunnel write controlling circuit 72b performs controlling of all of memory cells MC in memory cell array MCA for tunnel writing. Above-described write driver/sense amplifier controlling signal CTLS, high voltage/ground voltage switching signal SW1, high voltage/supply voltage switching signal SW2, and control signals AH, TP, EV are provided from over-erase detecting/tunnel write controlling circuit 72b. If tunnel writing into each memory cell MC is carried out by over-erase detecting/tunnel write controlling circuit 72b, electrons are injected into floating gate 55 in the transistor (See FIG. 6) constituting each memory cell. This causes the threshold voltage of each memory transistor to be high, and each memory transistor is changed from "depletion" into "enhance".

Figure 3:
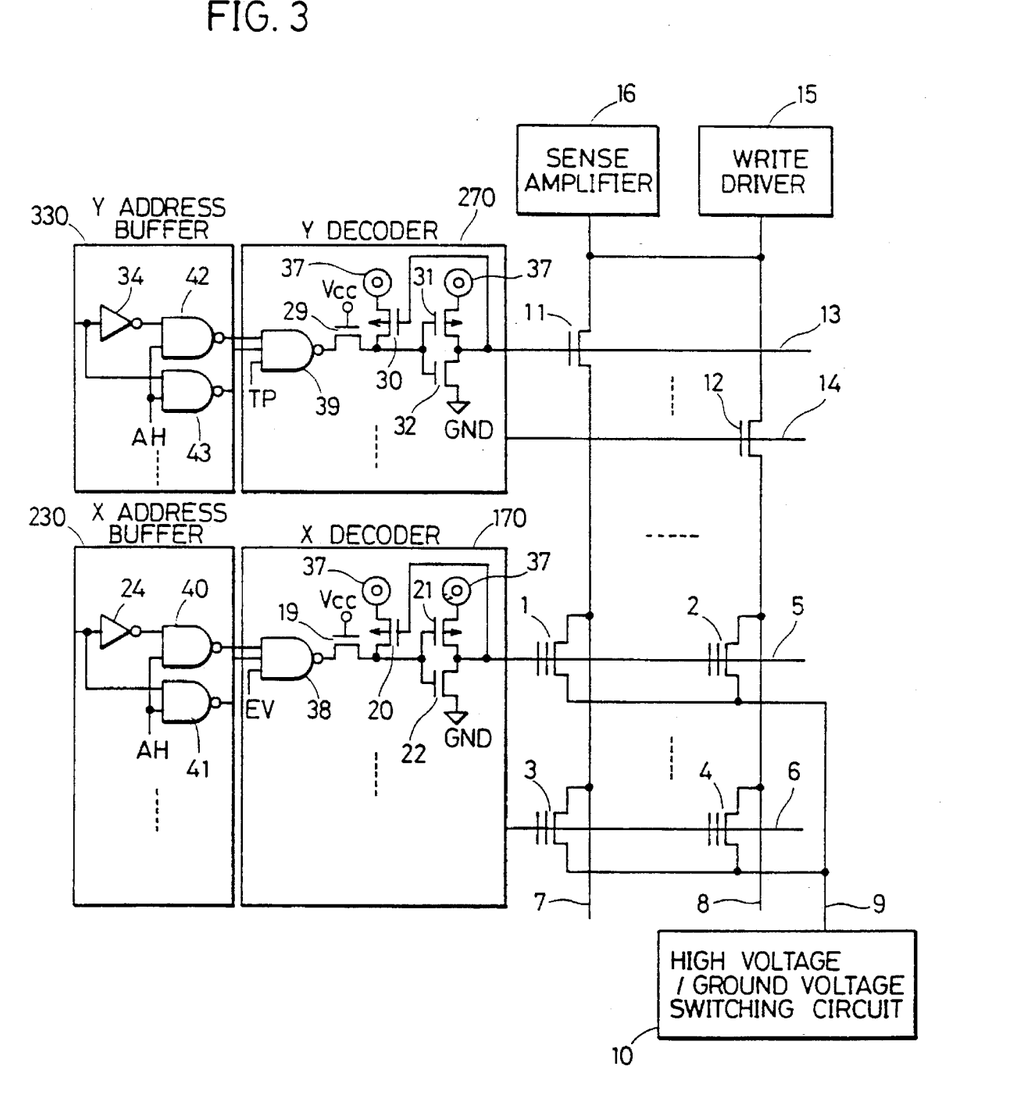
FIG. 3 is a circuit diagram illustrating the structure of a main part of the embodiment illustrated in FIG. 1.

FIG. 3 is a circuit diagram illustrating the structure of a main part of the embodiment illustrated in FIG. 1. While a case where four memory transistors 1–4 are arranged in two rows and two columns is illustrated in FIG. 3 for simplicity, a larger number of memory transistors are actually arranged. The circuit configuration of the embodiment illustrated in FIG. 3 is the same as the circuit configuration of the conventional non-volatile semiconductor memory device illustrated in FIG. 5 except for the following respects, and description of the corresponding parts which are given the same reference numerals will be omitted.

According to the embodiment illustrated in FIG. 3, a buffer circuit in X address buffer 230 is implemented with an inverter 24 and NAND gates 40, 41. X address buffer 230 includes the same number of buffer circuits, which have the same structure, as the number of bits of an externally applied X address signal. In each buffer circuit, while the applied X address signal is supplied to one input terminal of NAND gate 41, it is inverted by inverter 24 and then supplied to one input terminal of NAND gate 40 as well. Control signal AH is supplied from read/write/erase controlling circuit 71 and over-erase correcting circuit 72 in FIG. 1 to the other input terminal of each of NAND gates 40, 41. A decoding circuit in X decoder 170 is implemented with an NAND gate 38 and transistors 19–22. Either the output of NAND gate 40 or the output of NAND gate 41 is supplied from each buffer circuit in X address buffer 230 to NAND gate 38. In addition, control signal EV is supplied from read/write/erase controlling circuit 71 and over-erase correcting circuit 72 illustrated in FIG. 1 to NAND gate 38. Transistors 19–22 are connected in the same manner as those illustrated in FIG. 5. Terminal 37 is connected to high voltage/supply voltage switching circuit 370. X decoder 170 includes decoding circuits having the same structure as described above for respective word lines.

A buffer circuit in Y address buffer 330 is implemented with an inverter 34 and NAND gates 42, 43. Y address buffer 330 includes the same number of buffer circuits as the number of bits of an externally applied Y address signal. A signal of a corresponding bit in Y address signal is applied to each buffer circuit. While Y address signal applied to each buffer circuit is supplied to one input terminal of NAND gate 43, it is inverted by inverter 34 and then supplied to one input terminal of NAND gate 42 as well. Control signal AH is supplied from read/write/erase controlling circuit 71 and over-erase correcting circuit 72 in FIG. 1 to the other input terminal of each of NAND gates 42, 43. A decoding circuit in Y decoder 270 is implemented with an NAND gate 39 and transistors 29–32. Either the output of NAND gate 42 or the output of NAND gate 43 is supplied from each buffer circuit in Y address buffer 330 to NAND gate 39. In addition, control signal TP is supplied from read/write/erase circuit 71 and over-erase correcting circuit 72 in FIG. 1 to NAND gate 39. Transistors 29–32 are connected in the same manner as those illustrated in FIG. 5. Terminal 37 is connected to high voltage/supply voltage switching circuit 370 in FIG. 1. Y decoder 270 includes decoding circuits having the same structure as the one described above for respective Y gate lines.

Now, operation in the embodiments illustrated in FIGS. 1–3 will be described.

Figure 4:
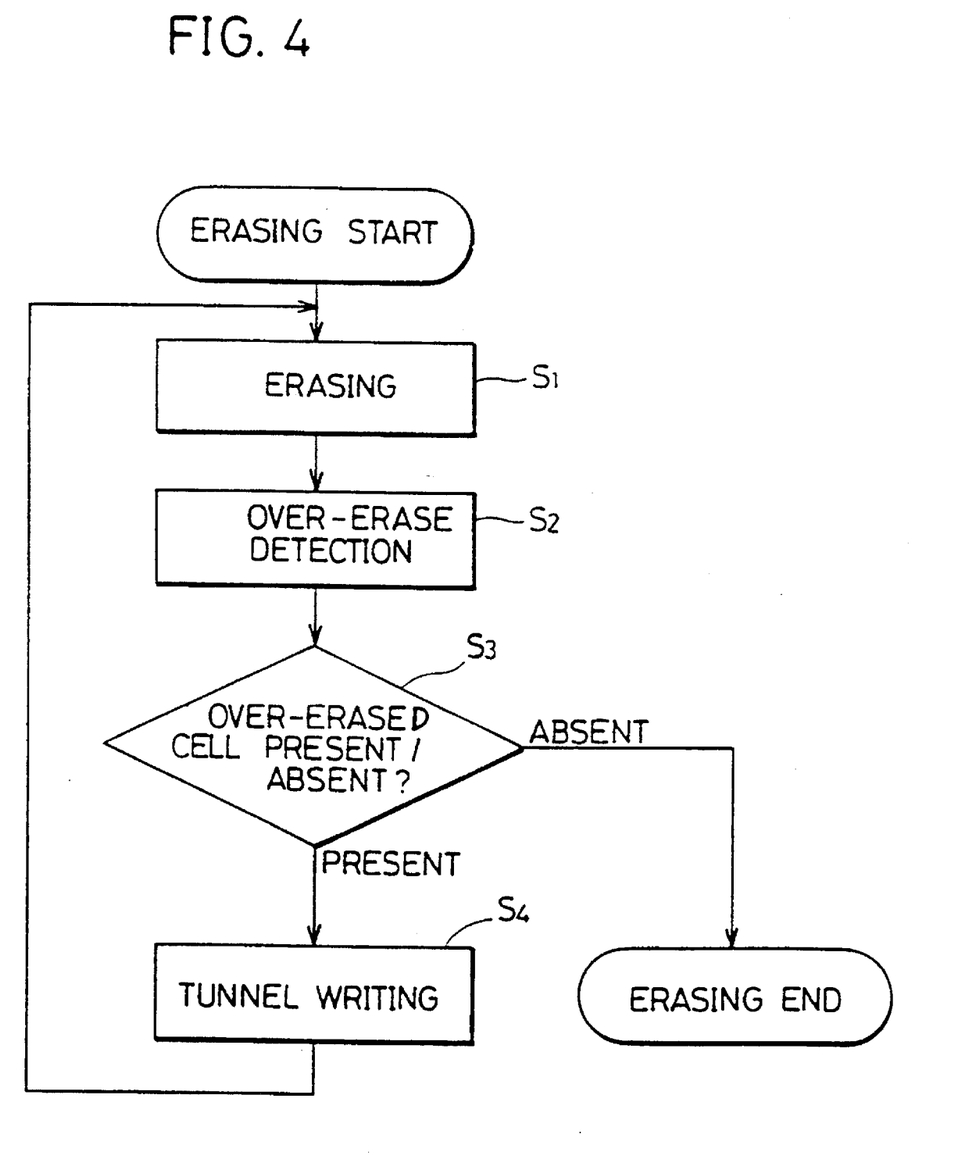
FIG. 4 is a flow chart for describing the characteristic operation of the embodiment illustrated in FIGS. 1–3.

First, referring to FIG. 4, a summary of operation of the characteristic parts in the above embodiment will be described. In a step S1, erasing of data is performed for all memory cells MC included in memory cell array MCA. The erase operation is performed by extracting electrons from floating gate 55 of the memory transistor (See FIG. 6) constituting each memory cell MC by a tunnel phenomenon. As a result, the threshold voltage of each memory transistor becomes low. At this time, if the erasing time is too long, the memory transistor is brought to the over-erase state. In a step S2, detection of whether there is any memory transistor in the over-erase state among the plurality of memory transistors included in memory cell array MCA is performed. Detection of the over-erase state is performed by over-erase detecting circuit 72a in over-erase correcting circuit 72. Then, in a step S3, in the case where it is determined that no memory transistor in the over-erase state has been detected, the erase operation is ended. On the other hand, if it is determined that a memory transistor in the over-erase state has been detected, tunnel writing into all memory cells MC is performed in a step S4. This tunnel writing is controlled by over-erase detecting/tunnel write controlling circuit 72b included in over-erase correcting circuit 72. Specifically, electrons are injected into floating gate 55 in the memory transistor constituting each memory cell by a tunnel phenomenon. This causes the threshold voltage of each memory transistor to be high. If tunnel writing in step S4 is ended, operation returns to step S1 again, and normal erase operation is performed. After normal erase operation is ended, the presence or absence of a memory cell in the erasing state is detected again, and in the case where there is still any memory cell in the over-erase state, tunnel writing in step S4 is repeated again. In the case where all memory cells are made to recover from the over-erase state by the series of operations, the erase operation is ended.

Now, further detailed operations in the embodiment illustrated in FIGS. 1–3 will be described.

First, the erase operation will be described. In this case, read/write/erase controlling circuit 71 is set to the erase mode by a control signal applied from control signal buffer CSB. Accordingly, all of the outputs of over-erase correcting circuit 72 are in a floating state. Read/write/erase controlling circuit 71 brings both of write driver 15 and sense amplifier 16 to an inactive state with write driver/sense amplifier controlling signal CTLS. Read/write/erase controlling circuit 71 controls high voltage/ground voltage switching circuit 10 by means of high voltage/ground voltage switching signal SW1 so that it provides a high voltage. Accordingly, a high voltage is applied through source line 9 illustrated in FIG. 3 to the source of each of memory transistors 1–4. Read/write/erase controlling circuit 71 controls high voltage/supply voltage switching circuit 370 by means of high voltage/supply voltage switching signal SW2 so that it provides the supply voltage. Therefore, supply voltage Vcc is applied to each terminal 37 in X decoder 170 and Y decoder 270. Read/write/erase controlling circuit 71 makes control signal AH to attain "H" level, control signal TP to attain "L" level, and control signal EV to attain "L" level. Control signal AH is at "H" level, so that all of NAND gates 41–43 operate as mere inverters. Specifically, X address buffer 230 and Y address buffer 330 perform the same operations as those of X address buffer 23 and Y address buffer 33 in FIG. 5 at this time. Control signal EV is at "L" level, so that the output of NAND gate 38 attains "H" level regardless of the output of X address buffer 230. The output of NAND gate 38 which is at "H" level is applied through transistor 19 to the gate of each of transistors 21, 22. Transistors 21, 22 constitute a CMOS inverter and invert the output of NAND gate 38. Accordingly, the output of X decoder 170 is the ground voltage with respect to both of word lines 5, 6. Therefore, the ground voltage is applied to gates of all of memory transistors 1–4. Control signal TP is at "L" level, so that the output of NAND gate 39 attains level regardless of the output of Y address buffer 330. Accordingly, the output of Y decoder 270 is the ground voltage with respect to both of Y gate lines 13, 14 as in the case of the above-described X decoder 170. Therefore, both of gate transistors 11, 12 are in OFF state. As described above, a high voltage is applied to the source, the ground voltage is applied to the control gate, and the drain is brought to the floating state in all of memory transistors 1–4. Accordingly, electrons are extracted from the floating gate toward the source in all memory transistors by a tunnel phenomenon. This causes the threshold voltage of all memory transistors to be low.

If the above-described erase operation is ended, the operation of detecting over-erasing of a memory cell is performed. Next, the operation of detecting over-erasing will be described. In this case, read/write/erase controlling circuit 71 is brought to the inactive state by a control signal applied through control signal buffer CSB. Therefore, all the outputs of read/write/erase controlling circuit 71 are in the floating state. On the other hand, in over-erase correcting circuit 72, over-erase detecting/tunnel write controlling circuit 72b applies a control signal to over-erase detecting circuit 72a and activates over-erase detecting circuit 72a. Over-erase detecting/tunnel write controlling circuit 72b inactivates write driver 15 and activates sense amplifier 16 with control signal CTLS. Over-erase detecting/tunnel write controlling circuit 72b controls high voltage/ground voltage switching circuit 10 by means of high voltage/ground voltage switching signal SW1 so that it provides the ground voltage. This causes the ground voltage to be applied to the source of each of memory transistors 1–4. Over-erase detecting/tunnel write controlling circuit 72b controls high voltage/supply voltage switching circuit 370 by means of high voltage/supply voltage switching signal SW2 so that it provides supply voltage Vcc. This causes supply voltage Vcc to be applied to terminal 37 in each of X decoder 170 and Y decoder 270. Over-erase detecting/tunnel write controlling circuit 72b makes control signal AH to attain "L" level, TP to attain "H" level, and EV to attain level. Control signal AH is at "L" level, so that the outputs of NAND gates 40–43 attain "H" level regardless of the logic level of the applied address signal. Specifically, all outputs of X address buffer 230 and all outputs of Y address buffer 330 attain "H" level. Control signal EV is at "L" level, so that the output of NAND gate 38 is fixed at "H" level. Therefore, all outputs of X decoder 170 become the ground voltage. Accordingly, the ground voltage is applied to the control gate of each of memory transistors 1–4. On the other hand, control signal TP is at "H" level, so that the output of NAND gate 39 is fixed at "L" level. This is because all the outputs applied from Y address buffer 330 to NAND gate 39 are at "H" level, and all the inputs of NAND gate 39 including control signal TP are at "H" level. The output of NAND gate 39 is at "L" level, so that all the outputs of Y decoder 270 become supply voltage Vcc. Specifically, in this case, transistor 31 is turned on in response to the output at "L" level of NAND gate 39, and supply voltage Vcc supplied from high voltage/supply voltage switching circuit 370 through terminal 37 is provided to each of Y gate lines 13, 14. Therefore, both of gate transistors 11, 12 are in ON state. As described above, the ground voltage is applied to the source and the control gate of each of memory transistors 1–4, and the drain of each of memory transistors 1–4 is connected through gate transistors 11, 12 to sense amplifier 16. At this time, if any memory transistor is in the over-erase state, it is turned on regardless of the ground voltage being applied to the control gate. Accordingly, current flows in the path of over-erase detecting circuit 72a→ the sense amplifier→the gate transistor→ the bit line→the drain-source of the memory transistor in the over-erase state→source line 9→high voltage/ground voltage switching circuit 10. Over-erase detecting circuit 72a detects the current at this time and detects the presence of a memory transistor in the over-erase state. The detection sensitivity of over-erase detecting circuit 72a is selected to be a sensitivity making it capable of detecting even when there is only one memory transistor in the over-erase state. Over-erase detecting circuit 72a provides a detection signal indicating the detection result to over-erase detecting/tunnel write controlling circuit 72b.

If the operation of detecting over-erasing performed by over-erase detecting circuit 72a is ended, over-erase detecting/tunnel write controlling circuit 72b sets the non-volatile semiconductor memory device to a tunnel write mode at this time in response to a control signal supplied from control signal buffer CSB. Specifically, over-erase detecting/tunnel write controlling circuit 72b inactivates both of write driver 15 and sense amplifier 16 by means of write driver/sense amplifier controlling signal CTLS. In addition, over-erase detecting/tunnel write controlling circuit 72b controls high voltage/ground voltage switching circuit 10 by means of high voltage/ground voltage switching signal SW1 so that it provides the ground voltage. This causes source line 9 to be grounded and the ground voltage to be applied to the source of each of memory transistors 1–4. Over-erase detecting/ tunnel write controlling circuit 72b switches high voltage/ supply voltage switching circuit 370 by means of high voltage/supply voltage switching signal SW2 so that it provides high voltage Vh. This causes high voltage Vh to be applied to terminal 37 in each of X decoder 170 and Y decoder 270. Over-erase detecting/tunnel write controlling circuit 72b makes control signal AH to attain "L" level, TP to attain "L" level, and EV to attain "H" level. Control signal AH is at "L" level, so that all the outputs of X address buffer 230 and Y address buffer 330 attain "H" level as on the occasion of over-erasing detection. Control signal EV is at "H" level, so that all the inputs of NAND gate 38 attain "H" level, and its output attains "L" level. Accordingly, transistor 21 is turned on by the output of NAND gate 38 at "H" level, and all the outputs of X decoder 170 attain high voltage Vh. Therefore, high voltage Vh is applied to the control gates of all memory transistors 1–4. On the other hand, control signal TP is at "L" level, so that the output of NAND gate 39 is fixed at "H" level. The output of NAND gate 39 at "L" level causes transistor 32 to be on and all the outputs of Y decoder 270 to be the ground voltage. Accordingly, the ground voltage is applied to the gate of each of gate transistors 11, 12, and all the gate transistors are in OFF state. As described above, the ground voltage is applied to the source of each of memory transistors 1–4, and high voltage Vh is applied to the control gate of each of memory transistors 1–4. Accordingly, electrons are injected from the source into the floating gate in each memory transistor by a tunnel phenomenon. Consequently, the threshold voltage of each memory transistor becomes high, and each memory transistor is changed from "depletion" to "enhance".

After tunnel writing is ended, over-erase detecting/tunnel write controlling circuit 72b returns the non-volatile semiconductor memory device into the normal erase mode again and performs the erase operation for a predetermined constant time. If the erase operation is ended, over-erase detecting/tunnel write controlling circuit 72b transmits a control signal to over-erase detecting circuit 72a and activates over-erase detecting circuit 72a again. Over-erase detecting circuit 72a detects the presence or absence of a memory cell in the over-erase state included in memory cell array MCA. This is because performing tunnel writing only once does not always make all memory cells recover from the over-erase state. At this time, if over-erase detecting circuit 72a detects a memory cell in the over-erase state, over-erase detecting/tunnel write controlling circuit 72b performs the operation of tunnel writing again. After this, tunnel writing and the normal erase operation are repeatedly performed by over-erase detecting/tunnel write controlling circuit 72b until no memory cell in the over-erase state is detected by over-erase detecting circuit 72a.

Now, the write operation will be described. In this case, read/write/erase controlling circuit 71 is set to the writing mode by a control signal applied through control signal buffer CSB, and over-erase correcting circuit 72 is inactivated. Therefore, each output of over-erase correcting circuit 72 is in the floating state. Read/write/erase controlling circuit 71 activates write driver 15 and inactivates sense amplifier 16 by means of write driver/sense amplifier controlling signal CTLS. Read/write/erase controlling circuit 71 controls high voltage/ground voltage switching circuit 10 by means of high voltage/ground voltage switching signal SW1 so that it provides the ground voltage. This causes the ground voltage to be applied to the source of each memory transistor in memory cell array MCA. Read/write/erase controlling circuit 71 controls high voltage/supply voltage switching circuit 370 by means of high voltage/supply voltage switching signal SW2 so that it provides a high voltage. This causes high voltage Vh to be applied to terminal 37 in each of X decoder 170 and Y decoder 270. Read/write/erase controlling circuit 71 makes all of control signals AH, TP, and EV to attain "H" level. Control signal AH is at "H" level, so that all of NAND gates 40, 41 in X address buffer 230 and NAND gates 42, 43 in Y address buffer 330 operate as inverters. Accordingly, X address buffer 230 and Y address buffer 330 perform exactly the same operations as those of X address buffer 23 and Y address buffer 33 in FIG. 5, respectively. Control signals EV and TP are at "H" level, so that NAND gate 38 in X decoder 170 and NAND gate 39 in Y decoder 270 perform exactly the same operations as those of NAND gate 18 in X decoder 17 and NAND gate 28 in Y decoder 27 illustrated in FIG. 5, respectively, with respect to the inputs thereto from X address buffer 230 and Y address buffer 330. Accordingly, X decoder 170 and Y decoder 270 perform exactly the same operations as those of X decoder 17 and Y decoder 27 illustrated in FIG. 5, respectively. At this time, exactly the same operation as the write operation of the conventional non-volatile semiconductor memory device illustrated in FIG. 5 is performed in the embodiment illustrated in FIGS. 1–3.

Now, the read operation will be described. In this case, read/write/erase controlling circuit 71 is set to the reading mode by a control signal applied through control signal buffer CSB, and over-erase correcting circuit 72 is inactivated. Therefore, each output of over-erase correcting circuit 72 is in the floating state. Read/write/erase controlling circuit 71 activates write driver 15 and inactivates sense amplifier 16 by means of write driver/sense amplifier controlling signal CTLS. Read/write/erase controlling circuit 71 controls high voltage/ground voltage switching circuit 10 by means of high voltage/ground voltage switching signal SW1 so that it provides the ground voltage. This causes the ground voltage to be applied to the source of each memory transistor in memory cell array MCA. Read/write/erase controlling circuit 71 controls high voltage/supply voltage switching circuit 370 by means of high voltage/supply voltage switching signal SW2 so that it provides supply voltage Vcc. This causes supply voltage Vcc to be applied to terminal 37 in each of X decoder 170 and Y decoder 270. Read/write/erase controlling circuit 71 makes all of control signals AH, TP, EV to attain "H" level. Accordingly, X address buffer 230, X decoder 170, Y address buffer 330, and Y decoder 270 perform exactly the same operations as those of X address buffer 23, X decoder 17, Y address buffer 33, and Y decoder 27 in FIG. 5, respectively, as in the above-described case of the writing operation. Therefore, in this case, exactly the same operation as the read operation in the conventional non-volatile semiconductor memory device illustrated in FIG. 5 is performed in the embodiment illustrated in FIGS. 1–3.

While the same sense amplifier 16 as the one in the conventional non-volatile semiconductor memory device illustrated in FIG. 5 is used in the embodiment described above, it is desirable to raise the sensitivity of the sense amplifier on the occasion of detecting over-erasing, because the current flowing in memory cells is reduced as the voltage of the control gate of the memory transistors is low on the occasion of detecting over-erasing.

While detecting of over-erasing is performed collectively in all memory transistors in the above described embodiment, it may be performed in bits, in bytes, or in blocks.

As described above, according to the present invention, if a memory cell is brought to the over-erase state because of a too long over-erasing time, for example, it is detected, and electrons are injected into the floating gate of a transistor constituting the memory cell, so that the memory cell can recover from the over-erase state to the normal state. Accordingly, it is possible to provide a non-volatile semiconductor memory device having high functions and high reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. Electrically erasable non-volatile semiconductor memory device, comprising:

a memory cell array including a plurality of memory cells arranged in a matrix manner, each memory cell having a source region, a drain region, a control gate and a floating gate; erasing means for erasing data stored in said plurality of memory cells by tunneling electrons from said floating gate to said source region;

writing means for writing data into a selected memory cell by injecting electrons to said floating gate via avalanche break down in the vicinity of the drain region;

reading means for reading data written in said memory cells;

over-erase detecting means responsive to said reading means for detecting whether at least one memory cell in said memory cell array is in the over erase state or not; and tunnel writing means responsive to detection of said at least one memory cell in the over-erase state by said over-erase detecting means for injecting electrons simultaneously into each floating gate of each of the memory cells commonly connected to a word line to which said at least one memory cell is connected by a tunnel phenomenon from a corresponding source region, said over-erase detecting means preventing tunnel writing from being performed if no memory cell is in the over-erase state.

2. The non-volatile semiconductor memory device according to claim 1, wherein said over-erase detecting means performs detection of the over-erase state collectively in all of said memory cells included in said memory cell array.

3. The non-volatile semiconductor memory device according to claim 2, wherein said over-erase detecting means includes:

means for applying a reading voltage to all of said memory cells; and means for determining whether there is any memory cell in the over-erase state on the basis of data read collectively from all of said memory cells.

4. The non-volatile semiconductor memory device according to claim 1, wherein said tunnel writing means injects electrons collectively into said floating gates of the transistors constituting all of said memory cells included in said memory cell array.

5. The non-volatile semiconductor memory device according to claim 1, wherein said over-erase detecting means performs detection of the over-erase state of said memory cells after data stored in said memory cells are erased by said erasing means.

6. The non-volatile semiconductor memory device according to claim 5, wherein said tunnel writing means repeats its operation until the over-erase state of said memory cells is not detected by said over-erase detecting means.

7. Electrically erasable non-volatile semiconductor memory device, comprising:

a memory cell array including a plurality of memory cells implemented with transistors each having a floating gate arranged in a matrix manner;

erasing means for erasing data stored in said plurality of memory cells;

writing means for writing data into a selected memory cells;

reading means for reading data written in said plurality of memory cells;

over-erase detecting means responsive to said reading means for inspecting said plurality of memory cells in said memory cell array to detect whether at least one memory cell is in the over-erase state or not; and tunnel writing means responsive to detection of said at least one memory cell in the over-erase state by said over-erase detecting means for injecting electrons simultaneously into the floating gate of each memory cell of the memory cell array by a tunnel phenomenon, said over-erase detecting means preventing tunnel writing from being performed if no memory cell is in the over-erase state.

* * * * *